US006906382B2

(12) United States Patent
Nakabayashi

(10) Patent No.: US 6,906,382 B2
(45) Date of Patent: Jun. 14, 2005

(54) SEMICONDUCTOR DEVICE AND METHOD OF FABRICATING THE SAME

(75) Inventor: Takashi Nakabayashi, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 89 days.

(21) Appl. No.: 09/968,940

(22) Filed: Oct. 3, 2001

(65) Prior Publication Data

US 2002/0014659 A1 Feb. 7, 2002

Related U.S. Application Data

(62) Division of application No. 09/392,584, filed on Sep. 9, 1999, now Pat. No. 6,319,782.

(30) Foreign Application Priority Data

Sep. 10, 1998 (JP) ............................................ 10-256277

(51) Int. Cl.[7] .............................................. H01L 29/76
(52) U.S. Cl. ........................ 257/336; 257/344; 438/300
(58) Field of Search ................................ 438/300, 301, 438/303, 305; 257/327, 336, 344

(56) References Cited

U.S. PATENT DOCUMENTS

| 5,124,276 A | * | 6/1992 | Samata et al. ............... 438/607 |
| 5,162,246 A | | 11/1992 | Ozturk et al. |
| 5,168,072 A | * | 12/1992 | Moslehi ....................... 438/300 |
| 5,242,847 A | | 9/1993 | Ozturk et al. |
| 5,504,031 A | * | 4/1996 | Hsu et al. .................... 438/231 |
| 5,637,518 A | * | 6/1997 | Prall et al. ................... 438/301 |
| 5,753,555 A | | 5/1998 | Hada |
| 5,843,826 A | * | 12/1998 | Hong ........................... 438/300 |
| 5,902,125 A | * | 5/1999 | Wu .............................. 438/300 |
| 6,015,740 A | | 1/2000 | Milic-Strkalj |
| 6,057,200 A | | 5/2000 | Prall et al. |
| 6,127,233 A | * | 10/2000 | Rodder ........................ 438/300 |
| 6,187,461 B1 | | 2/2001 | Lin et al. |

FOREIGN PATENT DOCUMENTS

| JP | 64-059861 | 3/1989 |
| JP | 01-270272 | 10/1989 |
| JP | 02-106922 | 4/1990 |
| JP | 04-234112 | 8/1992 |
| JP | 06-77246 | 3/1994 |
| JP | 06-151841 | 5/1994 |
| JP | 07-211906 | 8/1995 |

* cited by examiner

*Primary Examiner*—Richard A. Booth
(74) *Attorney, Agent, or Firm*—Nixon Peabody LLP; Donald R. Studebaker

(57) ABSTRACT

A gate electrode is formed on a semiconductor substrate with a gate insulating film interposed therebetween, and a sidewall spacer is then formed at the lateral sides of the gate electrode on the semiconductor substrate. Epitaxial growth is conducted at a lower growth rate to form, at both lateral sides of the sidewall spacer on the semiconductor substrate, first semiconductor layers made of first single-crystal silicon films superior in crystallinity. Then, epitaxial growth is conducted at a higher growth rate to form, on the first semiconductor layers, second semiconductor layers made of single-crystal films or polycrystalline films, which are inferior in crystallinity, or amorphous films. The upper areas of the first semiconductor layers and the whole areas of the second semiconductor layers are doped with impurity, thus forming impurity diffusion layers respectively serving as a source and a drain.

22 Claims, 13 Drawing Sheets

SEMICONDUCTOR DEVICE AND METHOD OF FABRICATING THE SAME

BACKGROUND OF THE INVENTION

The present invention relates to a semiconductor device having impurity layers, respectively serving as a source and a drain, at both lateral sides of agate electrode on the semiconductor substrate, and a method of fabricating the same.

Higher integration of LSIs has been achieved by miniaturizing integrated-circuit elements such as transistors, wirings and the like. Now, the LSI design rule reaches the range of 0.25 $\mu$m to 0.18 $\mu$m. Even in a logic LSI, transistors on the order of 10,000,000 pieces can be integrated in one chip. To make LSIs more multi-functionally operable at higher speed, it is considered that higher integration will increasingly be desired. It is therefore required to further miniaturize MOS transistors serving as LSI main component elements.

In miniaturization of a MOS transistor, the most important subject is how to solve a so-called short channel effect, i.e., a sudden drop in threshold voltage with the reduction in gate length. To solve this problem, it is most effective to minimize the depth of the impurity diffusion layers respectively serving as a source and a drain (shallow junction of impurity diffusion layers). To reduce the depth of the impurity diffusion layers, it is under examination to use, as a dopant, indium (p-type impurity) or antimony (n-type impurity) small in implantation range, and to activate the impurity by rapid thermal annealing in a short period of time.

On the other hand, the shallow junction of impurity diffusion layers results in increase in the sheet resistance of the impurity diffusion layers. This increases the parasitic resistance of the MOS transistor, contributing to the deterioration of the characteristics of the MOS transistor.

To solve the problem of increase in parasitic resistance, there are formed, on the impurity diffusion layers respectively serving as a source and a drain, high-melting-point metal silicide layers of titanium silicide, cobalt silicide or the like, or high-melting-point metal films of tungsten or the like.

However, when the technique of shallow junction of impurity diffusion layers is combined with the technique of forming, on the impurity diffusion layers, such high-melting-point metal silicide layers or high-melting-point metal films, this disadvantageously increases the junction leak current.

To solve this new problem, the Laid-Open Patent Publication No. H6-77246 proposes a MOS transistor having an elevated source-drain structure.

Referring to FIG. 13(a) to FIG. 13(b), the following description will discuss a method of fabricating such a MOS transistor having an elevated source-drain structure.

As shown in FIG. 13(a), an element separating area 702 and a gate insulating film 703 are formed on a p-type silicon substrate 701, and there is then formed, on the gate insulating film 703, a gate electrode comprising a lower n-type polycrystalline silicon layer 704 and an upper silicon oxide film 705.

As shown in FIG. 13(b), arsenic ions are implanted into the p-type silicon substrate 701 to form low-concentration impurity diffusion layers 707 respectively serving as a source and a drain, and a sidewall spacer 706 made of a silicon oxide film is then formed at the lateral sides of the gate electrode.

As shown in FIG. 13(c), monosilane is thermally decomposed to selectively grow silicon single-crystal films on the p-type silicon substrate 701 at areas exposed from the gate electrode and the sidewall spacer 706, and arsenic ions are then implanted into the silicon single-crystal films to form high-concentration impurity diffusion layers 708 respectively serving as a source and a drain.

Then, a titanium film is deposited on the high-concentration impurity diffusion layers 708, and a thermal treatment is then conducted to form titanium silicide layers 709 on the high-concentration impurity diffusion layers 708 as shown in FIG. 13(d). Then, non-reacted titanium film portions are removed with a mixture solution of sulfuric acid, hydrogen peroxide and water, or the like.

According to the MOS-transistor fabricating method above-mentioned, the high-concentration impurity diffusion layers respectively serving as a source and a drain are formed at positions upper than the transistor channel region, and only the low-concentration impurity diffusion layers are present in side of the silicon substrate. Thus, shallow junction is substantially formed to provide a transistor having characteristics excellent in short channel effect.

Further, the low-resistance titanium silicide layers are formed on the silicon single-crystal films grown on the silicon substrate. Accordingly, by increasing the thickness of the silicon single-crystal films, the titanium silicide layers can also be increased in thickness. This can lower the parasitic resistance.

According to the MOS transistor fabricating method above-mentioned, however, the treatment temperature is set as low as about 600° C. for example in order to grow, with good crystallinity, the silicon single-crystal films which will result in high-concentration impurity diffusion layers. This extremely increases the period of time during which the silicon single-crystal films are grown. This disadvantageously lowers the fabrication through-put, resulting in reduction in mass-productivity. Such a problem is generally encountered when silicon single-crystal films are formed by epitaxial growth.

SUMMARY OF THE INVENTION

In view of the foregoing, it is an object of the present invention to provide a semiconductor device and a method of fabricating the same excellent in mass-productivity by improving the through-put of MOS transistors having an elevated source-drain structure.

To achieve the object above-mentioned, the present invention is arranged such that single-crystal silicon films excellent in crystallinity are formed at a lower growth rate at both lateral sides of a gate electrode of the semiconductor substrate, semiconductor layers mainly made of silicon are then formed at a higher growth rate on the single-crystal silicon films thus formed, and impurity layers respectively serving as a source and a drain, are formed in the laminates of the single-crystal silicon films and the semiconductor layers such that the junction faces of the impurity layers are positioned in the single-crystal silicon films.

More specifically, a semiconductor device according to the present invention comprises: a gate electrode formed on a semiconductor substrate with a gate insulating film interposed therebetween; a pair of laminates respectively formed on the semi-conductor substrate at both lateral sides of the gate electrode with an insulating film interposed therebetween, each of the laminates including a lower first semiconductor layer made of silicon and an upper second semiconductor layer mainly made of silicon; and first impurity layers, respectively serving as a source and a drain, and respectively formed as extending over both the upper areas of the first semiconductor layers and the entire areas of the second semiconductor layers, the first semiconductor layers being made of single-crystal silicon films relatively superior in crystallinity, and the second semiconductor layers being made of single-crystal films or polycrystalline films, which are relatively inferior in crystallinity, or amorphous films.

According to this semiconductor device of the present invention, the impurity layers respectively serving as a source and a drain, are formed in the laminates of the first semiconductor layers made of single-crystal silicon films superior in crystallinity, and the second semiconductor layers made of single-crystal films or polycrystalline films, which are inferior in crystallinity, or amorphous films. This can increase the growth rate of the second semiconductor layers, resulting in the increased growth rate of the laminates in which the impurity layers are formed. This improves the through-put. Further, the junction faces of the impurity layers respectively serving as a source and a drain, are positioned inside of the first semiconductor layers superior in crystallinity. This prevents the junction leak current from being increased in spite of increased growth rate.

In the semiconductor device according to the present invention, the second semiconductor layers preferably contain germanium. According to such an arrangement, the growth rate of the second semiconductor layers can securely be increased because the growth rate of germanium itself is higher than that of silicon itself.

In the semiconductor device according to the present invention, the lower areas of the first semiconductor layers preferably are second impurity layers of which conductivity type is opposite to that of the first impurity layers. According to such an arrangement, pn-junctions are formed inside of the first semiconductor layers superior in crystallinity. This securely prevents the junction leak current from being increased.

In the semiconductor device according to the present invention, the lower areas of the first semiconductor layers preferably are low-concentration impurity layers of which conductivity type is the same as that of the first impurity layers and of which impurity-concentration is lower than that of the first impurity. According to such an arrangement, the junction faces between the impurity layers respectively serving as a source and a drain and the low-concentration impurity layers, are positioned inside of the first semiconductor layers superior in crystallinity. This securely prevents the junction leak current from being increased.

Preferably, the semiconductor device having the arrangement above-mentioned further comprises low-concentration impurity layers of which conductivity type is the same as that of the first impurity layers and of which impurity-concentration is lower than that of the first impurity layers, the low-concentration impurity layers being formed in the areas of the semiconductor substrate which come in contact with the first semiconductor layers. According to such an arrangement, the low-concentration impurity layers are interposed between the impurity layers respectively serving as a source and a drain and the impurity areas which have the opposite conductivity type and which are formed in the semiconductor substrate. This results in reduced parasitic resistance.

Preferably, the semiconductor device according to the present invention further comprises low-concentration impurity layers of which conductivity type is the same as that of the first impurity layers and of which impurity-concentration is lower than that of the first impurity layers, the low-concentration impurity layers being respectively formed as extending over both the lower areas of the first semiconductor layers at the side of the gate electrode and the semiconductor substrate. According to such an arrangement, the low-concentration impurity layers are interposed between the first impurity layers, and the channel region of the semiconductor substrate. This results in reduced parasitic resistance.

According to the present invention, a semiconductor device fabricating method comprises: the step of forming a gate electrode on a semiconductor substrate with a gate insulating film; the step of forming an insulating film at the lateral sides of the gate electrode on the semiconductor substrate; the step of forming first semiconductor layers made of single-crystal silicon films relatively superior in crystallinity respectively on the semiconductor substrate at both lateral sides of the gate electrode with the insulating film interposed therebetween by treating epitaxial growth at a lower growth rate; the step of forming second semiconductor layers made of single-crystal films or polycrystalline films, which are relatively inferior in crystallinity, or amorphous films respectively on the first semiconductor layers by treating epitaxial growth at a higher growth rate; and the step of doping, with impurity, the upper areas of the first semiconductor layers and the whole areas of the second semiconductor layers, thus forming first impurity layers respectively serving as a source and a drain.

According to this semiconductor device fabricating method of the present invention, epitaxial growth is conducted at a lower growth rate to form the first semiconductor layers made of single-crystal silicon films superior in crystallinity, and epitaxial growth is then conducted at a higher growth rate to form the second semiconductor layers, thus forming the laminates comprising the first and second semiconductor layers. This increases the growth rate of the laminates in which the impurity layers are formed. This results in improved through-put. Further, the junction faces of the impurity layers respectively serving as a source and a drain, are positioned inside of the first semiconductor layers superior in crystallinity. This prevents the junction leak current from being increased, in spite of increased growth rate.

In the semiconductor device fabricating method according to the present invention, the flow amount of material gas introduced at the step of forming the second semiconductor layers is preferably greater than that of material gas introduced at the step of forming the first semiconductor layers. According to such an arrangement, the growth rate at the step of forming the second semiconductor layers can securely be made higher than the growth rate at the step of forming the first semiconductor layers.

In the semiconductor device fabricating method according to the present invention, the treatment temperature at the step of forming the second semiconductor layers is preferably higher than that at the step of forming the first semiconductor layers. According to such an arrangement, the growth rate at the step of forming the second semiconductor layers can securely be made higher than the growth rate at the step of forming the first semiconductor layers.

Preferably, the semiconductor device fabricating method according to the present invention is arranged such that the material gas introduced at the step of forming the first semiconductor layers contains no germanium, while the material gas introduced at the step of forming the second semiconductor layers contains germanium. According to such an arrangement, the growth rate of the second semiconductor layers can securely be made higher than that of the first semiconductor layers because the growth rate of germanium itself is higher than that of silicon itself.

Preferably, the semiconductor device fabricating method according to the present invention further comprises, after the step of forming the first impurity layers: the step of removing the insulating film to form a space between the gate electrode, and the first and second semiconductor layers; and the step of implanting impurity from the space into the first semiconductor layers and the semiconductor substrate, thus forming low-concentration impurity layers of which conductivity type is the same as that of the first impurity layers and of which impurity-concentration is lower than that of the first impurity layers, the low-concentration impurity layers being respectively formed as extending over both the lower areas of the first semiconductor layers at the side of the gate electrode and the semiconductor substrate.

According to such an arrangement, when impurity is implanted into the first semiconductor layers and the semiconductor substrate from the space formed between the gate electrode and the first and second semiconductor layers, the low-concentration impurity layers can securely be formed as extending over both the lower areas of the first semiconductor layers at the side of the gate electrode and the semiconductor substrate.

Preferably, the semiconductor device fabricating method according to the present invention is arranged such that the insulating film contains impurity of which conductivity type is the same as that of the first impurity layers, and that there is further conducted, after the step of forming the first semiconductor layers, the step of diffusing the impurity contained in the insulating film into the first semiconductor layers and the semiconductor substrate, thereby to form low-concentration impurity layers of which conduction type is the same as that of the first impurity layers and of which impurity-concentration is lower than that of the first impurity layers, the low-concentration impurity layers being respectively formed as extending over both the lower areas of the first semiconductor layers at the side of the gate electrode and the semiconductor substrate.

According to such an arrangement, when the impurity contained in the insulating film is diffused into the first semiconductor layers and the semiconductor substrate, the low-concentration impurity layers can securely be formed as extending over both the lower areas of the first semiconductor layers at the side of the gate electrode and the semiconductor substrate.

DETAILED DESCRIPTION OF THE INVENTION

Embodiment 1

With reference to FIG. 1(a) to FIG. 1(c) and FIG. 2(a) to FIG. 2(c), the following description will discuss a semiconductor device and a method of fabricating the same according to a first embodiment of the present invention.

Figure 1A:
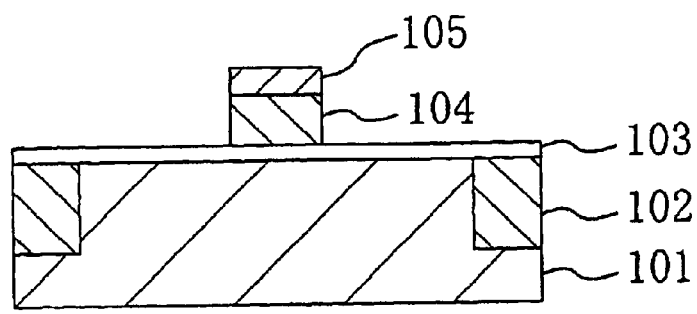
FIG. 1(a) to FIG. 1(c) are section views illustrating steps of a semiconductor device fabricating method according to a first embodiment of the present invention.

As shown in FIG. 1(a), an element separating area 102 such as LOCOS or trench is first formed, and a gate insulating film 103 having a thickness of 3~8 nm is then formed on a p-type silicon substrate 101. Then, according to a known method, there is formed, on the gate insulating film 103, a gate electrode comprising a lower n-type polycrystalline silicon layer 104 having a thickness of 100~300 nm and an upper silicon oxide film 105 having a thickness of 50~200 nm. The gate electrode has a gate length of 0.1 to 0.2 $\mu$m for example, and a gate width of 1~10 $\mu$m for example. Instead of the upper silicon oxide film 105, a silicon nitride film may be formed.

Figure 1B:
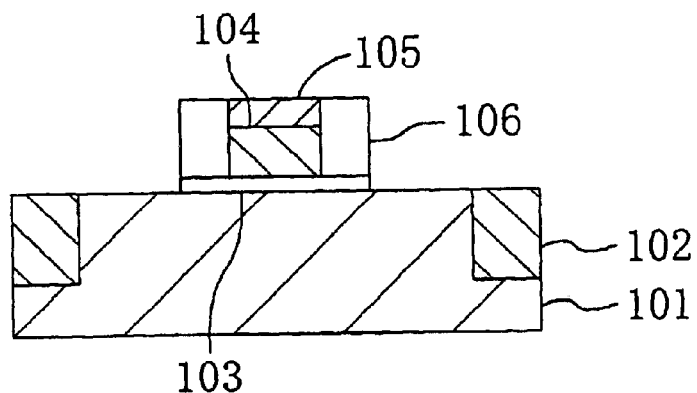

Then, a silicon nitride film having a thickness of 30~100 nm for example is deposited entirely on the p-type silicon substrate 101, and the silicon nitride film is then subjected to anisotropic dry etching to form a sidewall spacer 106 made of the silicon nitride film at the lateral sides of the gate electrode, as shown in FIG. 1(b). It is noted that the sidewall spacer 106 may also be formed by a silicon oxide film.

Figure 1C:
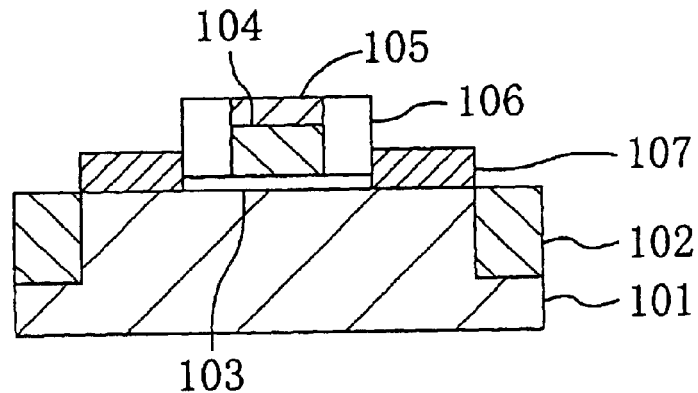

With the introduction of disilane gas at a flow rate of 3 sccm, diboron gas at a flow rate of 0.01 sccm and chlorine gas at a flow rate of 0.02 sccm, epitaxial growth is conducted at treatment temperature of 630° C. Thus, as shown in FIG. 1(c), p-type first single-crystal silicon films 107 excellent in crystallinity having a thickness of about 50 nm, are formed on the p-type silicon substrate 101 at areas exposed from the gate electrode and the sidewall spacer 106. Here, the chlorine gas is introduced to remove the amorphous silicon oxide films which undesirably grow on the silicon oxide film or the silicon nitride film.

At the step of growing the first single-crystal silicon films 107, the growth rate is as low as about 10 nm/min. However, precisely because the growth rate is low, the first single-crystal silicon films 107 are excellent in crystallinity and their crystal structures are substantially free from defects.

At the step of growing the first single-crystal silicon films 107, there may be used (i) other silicon compound gas such as silane gas, instead of the disilane gas, (ii) other boron compound gas such as boron gas, instead of the diboron gas, and (iii) other chlorine compound gas instead of the chlorine gas.

Figure 2A:
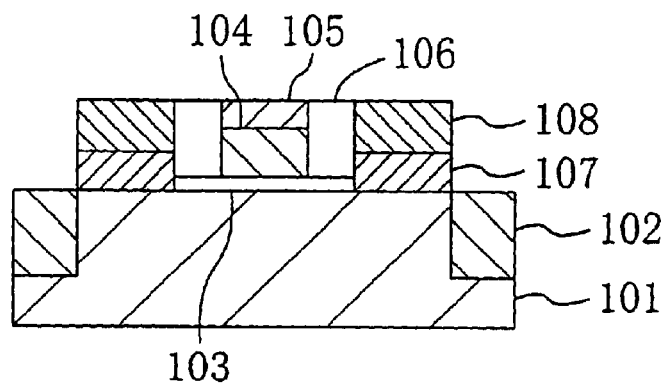
FIG. 2(a) to FIG. 2(c) are section views illustrating steps of the semiconductor device fabricating method according to the first embodiment of the present invention.

With the introduction of disilane gas at a flow rate of 10 sccm and chlorine gas at a flow rate of 0.04 sccm, epitaxial growth is conducted at treatment temperature of 630° C. Thus, as shown in FIG. 2(a), nondope-type second single-crystal silicon films 108 having a thickness of about 100 nm are formed on the first single-crystal silicon films 107. Here, the chlorine gas is introduced to remove the amorphous silicon oxide films which undesirably grow on the silicon oxide film or the silicon nitride film.

At the step of growing the second single-crystal silicon films 108, the growth rate is as high as about 20 nm/min. because the amount of the introduced material gases is greater than that at the step of growing the first single-crystal silicon films 107. However, precisely because the growth rate is high, the second single-crystal silicon films 108 are inferior in crystallinity to the first single-crystal silicon films 107 and their crystal structures contain defects.

At the step of growing the second single-crystal silicon films 108, there may be used (i) other silicon compound gas such as silane gas instead of the disilane gas, and (ii) other chlorine compound gas instead of the chlorine gas.

Instead of the second single-crystal silicon films 108, there may be formed films such as polycrystalline silicon films or amorphous silicon films which are high in growth rate but which are inferior in crystallinity to the first single-crystal silicon films 107.

Figure 2B:
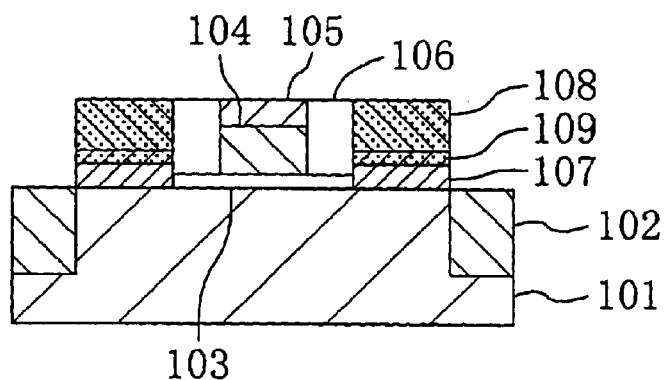

Then, a dose $2 \times 10^{15}$ cm$^{-2}$ of arsenic ions is implanted into the first single-crystal silicon films 107 and the second single-crystal silicon films 108 at an energy of 40 keV, and a thermal treatment at temperature of 950° C. for example is then conducted for about 30 seconds. Thus, as shown in FIG. 2(b), n-type impurity diffusion layers 109 respectively serving as a drain and a source, are formed in the areas (shown by dots) extending both the whole second single-crystal silicon films 108 and the upper portions of the first single-crystal silicon films 107. At this time, the upper portions of the p-type first single-crystal silicon films 107 into which n-type impurity ions have been implanted, are changed into n-type areas. Thus, pn-junctions are formed inside of the first single-crystal silicon films 107.

It is noted that, instead of arsenic ions, n-type impurity ions such as phosphorus ions may be used as impurity ions for forming the n-type impurity diffusion layers 109.

Figure 2C:
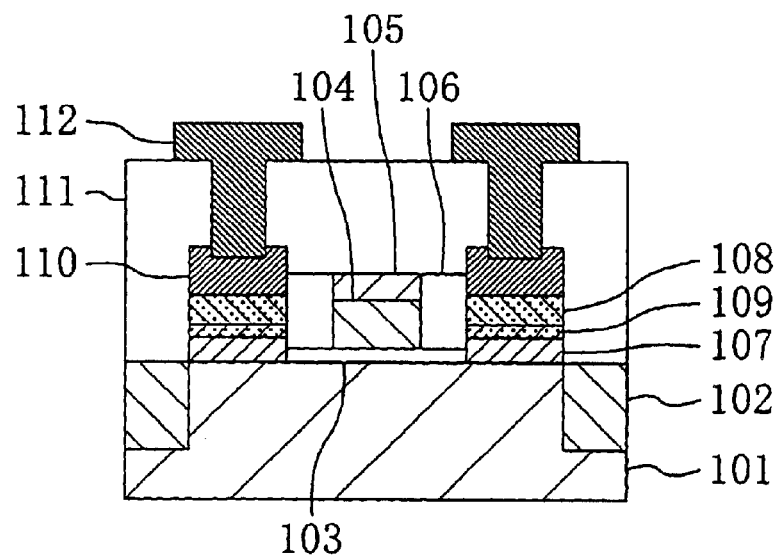

Then, a titanium film having a thickness of about 50 nm is deposited entirely on the p-type silicon substrate 101, and a thermal treatment at 650° C. is conducted for about 60 seconds to form titanium silicide layers 110 at the upper portions of the second single-crystal silicon films 108 as shown in FIG. 2(c). Then, after the non-reacted titanium film portions are removed with a mixture solution of sulfuric acid, hydrogen peroxide and water, or the like, a thermal treatment at 900° C. is conducted for about 10 seconds to lower the titanium silicide layers 110 in resistance.

Then, deposited on the p-type silicon substrate 101 is an interlaminar insulating film 111, in which there are then formed metallic electrodes 112 respectively serving as a source electrode and a drain electrode, thus forming a semiconductor device according to the first embodiment.

According to the first embodiment, the growth rate is higher at the step of growing the second single-crystal silicon films 108 than the step of growing the first single-crystal silicon films 107 because the amount of the introduced material gases is greater at the film 108 growing step than the film 107 growing step. Accordingly, the growth rate of laminates of the first and second single-crystal silicon films 107 and 108, is higher than that of the conventional method of forming only the single-crystal silicon films excellent in crystallinity. More specifically, each of the film 107 growing step and the film 108 growing step takes about 5 minutes as the growth time. Thus, the total growth time is about 10 minutes, which means a reduction to about ⅔ as compared with about 15 minutes according to the conventional method.

Because of high growth rate, the second single-crystal silicon films 108 are inferior in crystallinity. However, no influence is exerted to junction leak and the like because the upper portions of the second single-crystal silicon films 108 are changed into the titanium silicide layers 110 and the lower portions of the second single-crystal silicon films 108 are included in the impurity diffusion layers 109.

Further, the junction leak current is not increased in amount because the pn-junctions are formed inside of the first single-crystal silicon films 107 excellent in crystallinity.

Embodiment 2

With reference to FIG. 3(a) to FIG. 3(c) and FIG. 4(a) to FIG. 4(c), the following description will discuss a semiconductor device and a method of fabricating the same according to a second embodiment of the present invention.

Figure 3A:
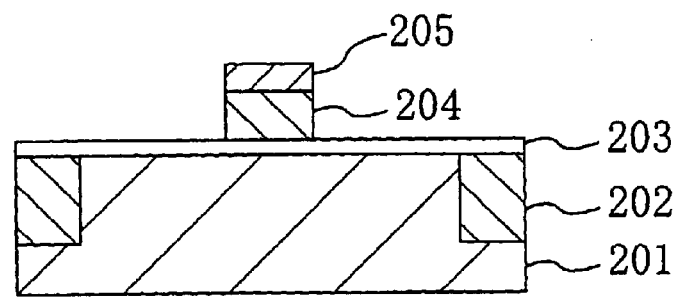
FIG. 3(a) to FIG. 3(c) are section views illustrating steps of a semiconductor device fabricating method according to a second embodiment of the present invention.

As shown in FIG. 3(a), an element separating area 202 such as LOCOS or trench is first formed, and a gate insulating film 203 having a thickness of 3~8 nm is then formed on a p-type silicon substrate 201. Then, according to a known method, there is formed, on the gate insulating film 203, a gate electrode comprising a lower n-type polycrystalline silicon layer 204 having a thickness of 100~300 nm and an upper silicon oxide film 205 having a thickness of 50~200 nm. The gate electrode has a gate length of 0.1 to 0.2 μm for example, and a gate width of 1~10 μm for example. Instead of the upper silicon oxide film 205, a silicon nitride film may be formed.

Figure 3B:
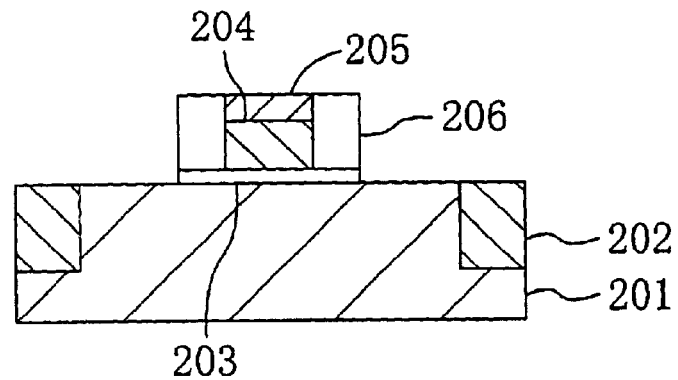

Then, a silicon nitride film having a thickness of 30~100 nm for example is deposited entirely on the p-type silicon substrate 201, and the silicon nitride film is then subjected to anisotropic dry etching to form a sidewall spacer 206 made of the silicon nitride film at the lateral sides of the gate electrode, as shown in FIG. 3(b). It is noted that the sidewall spacer 206 may also be formed by a silicon oxide film.

Figure 3C:
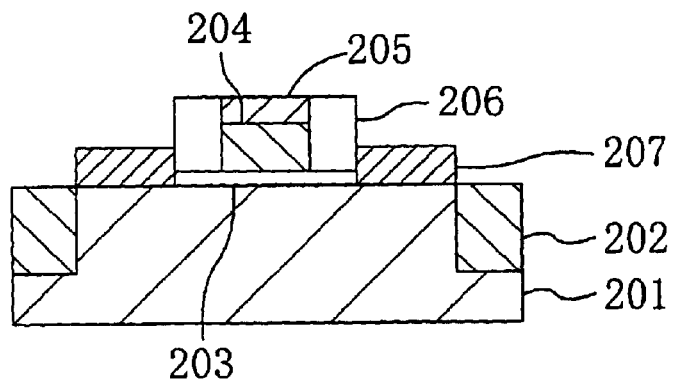

With the introduction of disilane gas at a flow rate of 3 sccm, diboron gas at a flow rate of 0.01 sccm and chlorine gas at a flow rate of 0.02 sccm, epitaxial growth is conducted at treatment temperature of 630° C. Thus, as shown in FIG. 3(c), p-type first single-crystal silicon films 207 excellent in crystallinity having a thickness of about 50 nm, are formed on the p-type silicon substrate 201 at areas exposed from the gate electrode and the sidewall spacer 206. Here, the chlorine gas is introduced to remove the amorphous silicon oxide films which undesirably grow on the silicon oxide film or the silicon nitride film.

At the step of growing the first single-crystal silicon films 207, the growth rate is as low as about 10 nm/min. However, precisely because the growth rate is low, the first single-crystal silicon films 207 are excellent in crystallinity and their crystal structures are substantially free from defects.

At the step of growing the first single-crystal silicon films 207, there may be used (i) other silicon compound gas such as silane gas, instead of the disilane gas, (ii) other boron compound gas such as boron gas, instead of the diboron gas, and (iii) other chlorine compound gas instead of the chlorine gas.

Figure 4A:
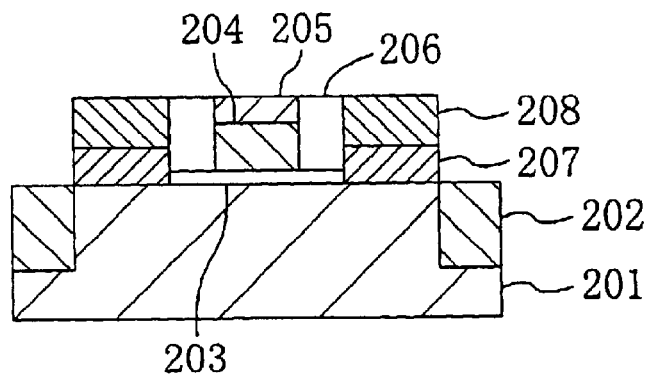
FIG. 4(a) to FIG. 4(c) are section views illustrating steps of the semiconductor device fabricating method according to the second embodiment of the present invention.

With the introduction of disilane gas at a flow rate of 3 sccm and chlorine gas at a flow rate of 0.04 sccm, epitaxial growth is conducted at treatment temperature of 700° C. Thus, as shown in FIG. 4(a), nondope-type second single-crystal silicon films 208 having a thickness of about 100 nm are formed on the first single-crystal silicon films 207. Here, the chlorine gas is introduced to remove the amorphous silicon oxide films which undesirably grow on the silicon oxide film or the silicon nitride film.

At the step of growing the second single-crystal silicon films 208, the growth rate is as high as about 40 nm/min. because the treatment temperature is higher than that at the step of growing the first single-crystal silicon films 207. However, precisely because the growth rate is high, the second single-crystal silicon films 208 are inferior in crystallinity to the first single-crystal silicon films 207 and their crystal structures contain defects.

At the step of growing the second single-crystal silicon films 208, there may be used (i) other silicon compound gas such as silane gas instead of the disilane gas, and (ii) other chlorine compound gas instead of the chlorine gas.

Instead of the second single-crystal silicon films 208, there may be formed films such as polycrystalline silicon films or amorphous silicon films which are high in growth rate but which are inferior in crystallinity to the first single-crystal silicon films 207.

Figure 4B:
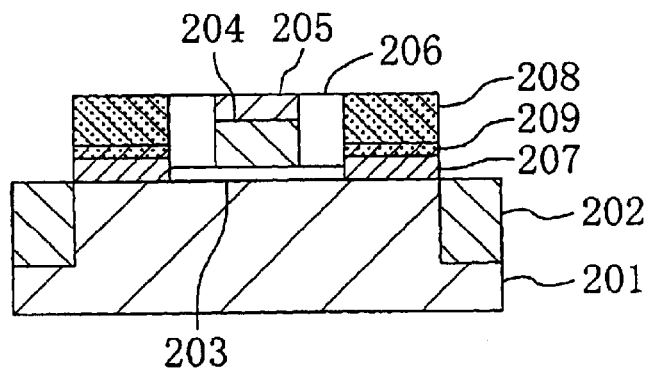

Then, a dose $2\times10^{15}$ cm$^{-2}$ of arsenic ions is implanted into the first single-crystal silicon films 207 and the second single-crystal silicon films 208 at an energy of 40 keV, and a thermal treatment at temperature of 950° C. for example is then conducted for about 30 seconds. Thus, as shown in FIG. 4(b), n-type impurity diffusion layers 209 respectively serving as a drain and a source, are formed in the areas (shown by dots) extending both the whole second single-crystal silicon films 208 and the upper portions of the first single-crystal silicon films 207. At this time, the upper portions of the p-type first single-crystal silicon films 207 into which n-type impurity ions have been implanted, are changed into n-type areas. Thus, pn-junctions are formed inside of the first single-crystal silicon films 207.

It is noted that, instead of arsenic ions, n-type impurity ions such as phosphorus ions maybe used as impurity ions for forming the n-type impurity diffusion layers 209.

Figure 4C:
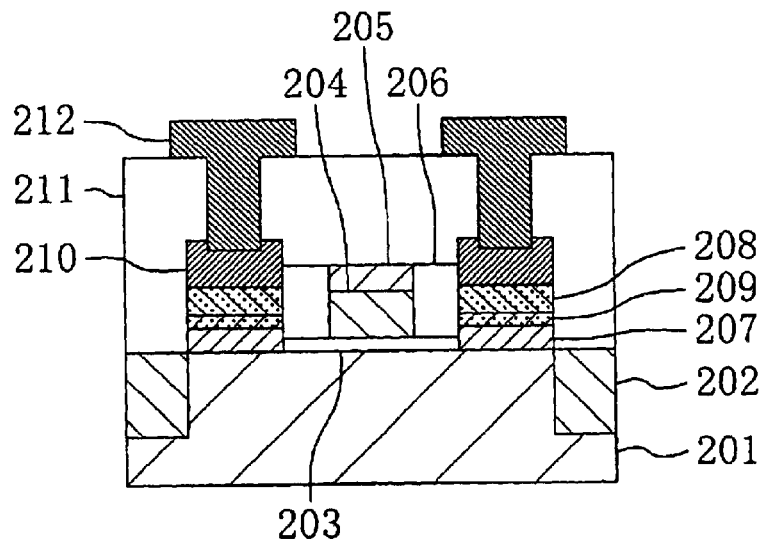

Then, a titanium film having a thickness of about 50 nm is deposited entirely on the p-type silicon substrate 201, and a thermal treatment at 650°0 C. is conducted for about 60 seconds to form titanium silicide layers 210 at the upper portion of the second single-crystal silicon films 208 as shown in FIG. 4(c). Then, after the non-reacted titanium film portions are removed with a mixture solution of sulfuric acid, hydrogen peroxide and water, or the like, a thermal treatment at 900° C. is conducted for about 10 seconds to lower the titanium silicide layers 210 in resistance.

Then, deposited on the p-type silicon substrate 201 is an interlaminar insulating film 211, in which there are then formed metallic electrodes 212 respectively serving as a source electrode and a drain electrode, thus forming a semiconductor device according to the second embodiment.

According to the second embodiment, the growth rate is higher at the step of growing the second single-crystal silicon films 208 than at the step of growing the first single-crystal silicon films 207 because the treatment temperature is higher at the film 208 growing step than the film 207 growing step. Accordingly, the growth rate of laminates of the first and second single-crystal silicon films 207 and 208, is higher than that of the conventional method of forming only the single-crystal silicon films excellent in crystallinity. More specifically, the step of growing the first single-crystal silicon films 207 takes about 5 minutes as the growth time, and the step of growing the second single-crystal silicon films 208 takes about 2.5 minutes as the growth time. Thus, the total growth time is about 7.5 minutes, which means a reduction to about ½ as compared with about 15 minutes according to the conventional method.

Because of their higher growth rate, the second single-crystal silicon films 208 are inferior in crystallinity. However, no influence is exerted to junction leak and the like because the upper portions of the second single-crystal silicon films 208 are changed into the titanium silicide layers 210 and the lower portions of the second single-crystal silicon films 208 are included in the impurity diffusion layers 209.

Further, the junction leak current is not increased in amount because the pn-junctions are formed inside of the first to single-crystal silicon films 207 excellent in crystallinity.

Embodiment 3

With reference to FIG. 5(a) to FIG. 5(c) and FIG. 6(a) to FIG. 6(c), the following description will discuss a semiconductor device and a method of fabricating the same according to a third embodiment of the present invention.

Figure 5A:
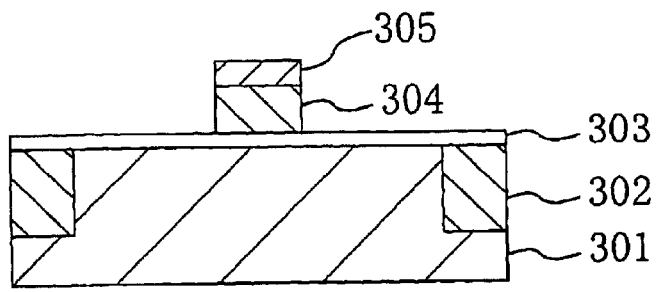
FIG. 5(a) to FIG. 5(c) are section views illustrating steps of a semiconductor device fabricating method according to a third embodiment of the present invention.

As shown in FIG. 5(a), an element separating area 302 such as LOCOS or trench is first formed, and a gate insulating film 303 having a thickness of 3~8 nm is then formed on an n-type silicon substrate 301. Then, according to a known method, there is formed, on the gate insulating film 303, a gate electrode comprising a lower p-type polycrystalline silicon layer 304 having a thickness of 100~300 nm and an upper silicon oxide film 305 having a thickness of 50~200 nm. The gate electrode has a gate length of 0.1 to 0.2 µm for example, and a gate width of 1~10 µm for example. Instead of the upper silicon oxide film 305, a silicon nitride film may be formed.

Figure 5B:
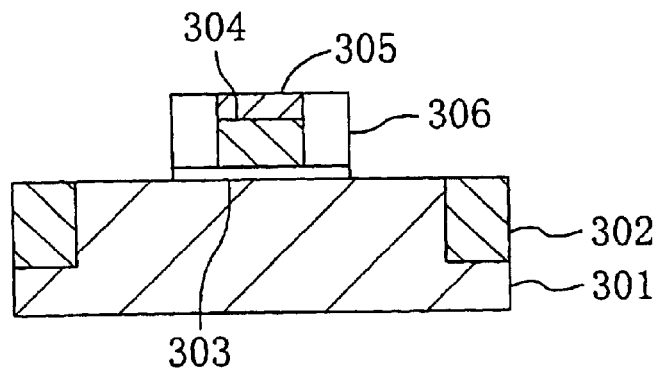

Then, a silicon nitride film having a thickness of 30~100 nm for example is deposited entirely on the n-type silicon substrate 301, and the silicon nitride film is then subjected to anisotropic dry etching to form a sidewall spacer 306 made of the silicon nitride film at the lateral sides of the gate electrode, as shown in FIG. 5(b). It is noted that the sidewall spacer 306 may also be formed by a silicon oxide film.

Figure 5C:
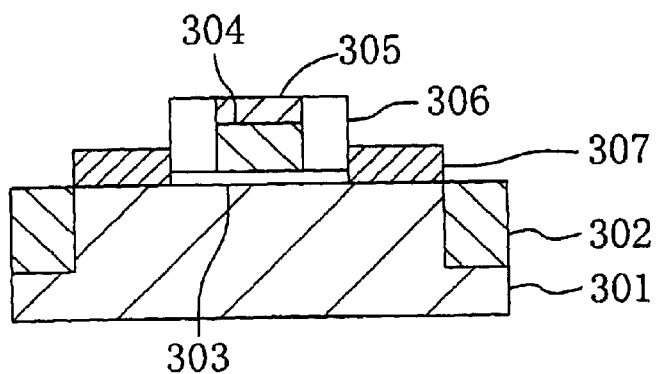

With the introduction of disilane gas at a flow rate of 3 sccm, phosphine gas at a flow rate of 0.001 sccm and chlorine gas at a flow rate of 0.02 sccm, epitaxial growth is conducted at treatment temperature of 630° C. Thus, as shown in FIG. 5(c), n-type single-crystal silicon films 307 excellent in crystallinity having a thickness of about 50 nm, are formed on the n-type silicon substrate 301 at areas exposed from the gate electrode and the sidewall spacer 306. Here,the chlorine gas is introduced to remove the amorphous silicon oxide films which undesirably grow on the silicon oxide film or the silicon nitride film.

At the step of growing the single-crystal silicon films 307, the growth rate is as low as about 10 nm/min. However, precisely because the growth rate is low, the single-crystal silicon films 307 are excellent in crystallinity and their crystal structures are substantially free from defects.

At the step of growing the single-crystal silicon films 307, there may be used (i) other silicon compound gas such as silane gas, instead of the disilane gas, (ii) other n-type impurity compound gas such as arsine gas or the like instead of the phosphine gas, and (iii) other chlorine compound gas instead of the chlorine gas.

Figure 6A:
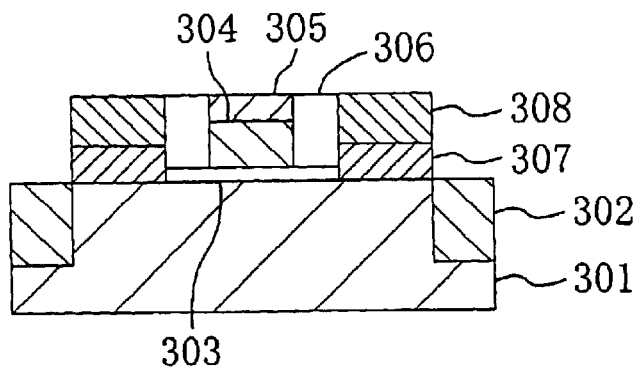
FIG. 6(a) to FIG. 6(c) are section views illustrating steps of the semiconductor device fabricating method according to the third embodiment of the present invention.

With the introduction of disilane gas at a flow rate of 2.5 sccm, monogermane gas at a flow rate of 0.5 sccm and chlorine gas at a flow rate of 0.02 sccm, epitaxial growth is conducted at treatment temperature of 630° C. Thus, as shown in FIG. 6(a), nondope-type single-crystal silicon germanium films 308 having a thickness of about 100 nm are formed on the single-crystal silicon films 307. Here, the chlorine gas is introduced to remove the amorphous silicon oxide films which undesirably grow on the silicon oxide film or the silicon nitride film.

The growth temperature of germanium itself is lower than that of silicon itself, and the treatment temperature at which the single-crystal silicon films 307 are grown, is substantially equal to the treatment temperature at which the single-crystal silicon germanium films 308 are grown. Accordingly, the growth rate of the single-crystal silicon germanium films 308 is about 50 nm/min. which is higher than that of the single-crystal silicon films 307. However, precisely because the growth rate is higher, the single-crystal silicon germanium films 308 are inferior in crystallinity to the single-crystal silicon films 307 and their crystal structures contain defects.

At the step of growing the single-crystal silicon germanium films 308, there may be used (i) other silicon compound gas such as silane gas instead of the disilane gas, (ii) other germanium compound gas instead of the monogermane gas and (iii) other chlorine compound gas instead of the chlorine gas.

Instead of the single-crystal silicon germanium films 308, there may be formed films such as polycrystalline silicon films or amorphous silicon films which are high in growth rate but which are inferior in crystallinity to the single-crystal silicon films 307.

Figure 6B:
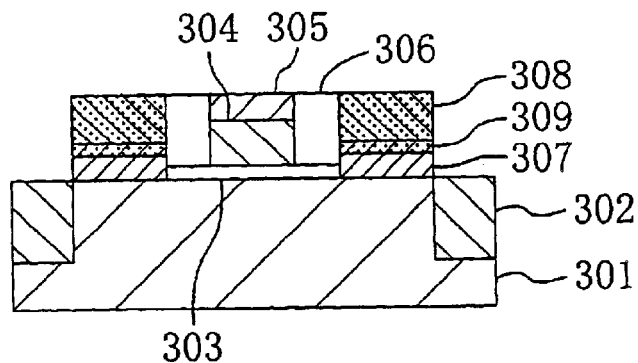

Then, a dose $2 \times 10^{15}$ cm$^{-2}$ of boron ions is implanted into the single-crystal silicon films 307 and the single-crystal silicon germanium films 308 at an energy of 10 keV, and a thermal treatment at temperature of 950° C. for example is then conducted for about 30 seconds. Thus, as shown in FIG. 6(b), p-type impurity diffusion layers 309 respectively serving as a drain and a source, are formed in the areas (shown by dots) extending both the whole single-crystal silicon germanium films 308 and the upper portions of the single-crystal silicon films 307. At this time, the upper portions of the n-type single-crystal silicon films 307 into which p-type impurity ions have been implanted, are changed into p-type areas. Thus, pn-junctions are formed inside of the single-crystal silicon films 307.

It is noted that, instead of the boron ions, p-type impurity ions such as manganese difluoride ions or the like may be used as the impurity ions for forming the p-type impurity diffusion layers 309.

Figure 6C:
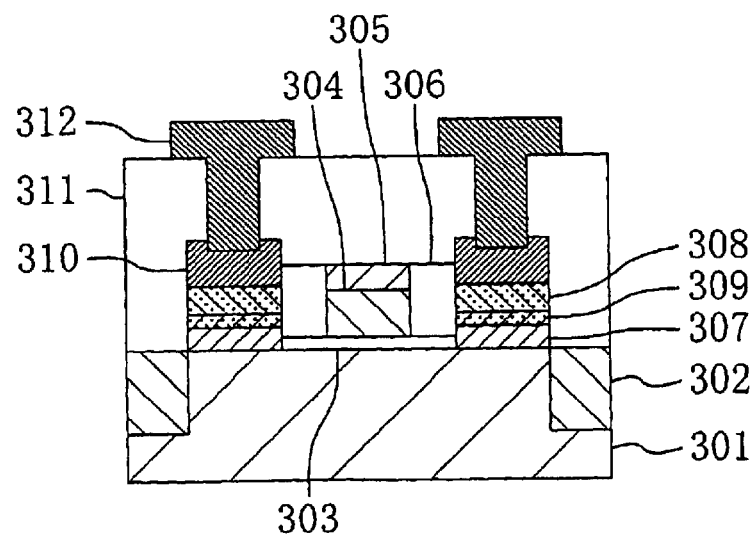

Then, a titanium film having a thickness of about 50 nm is deposited entirely on the n-type silicon substrate 301, and a thermal treatment at 650° C. is conducted for about 60 seconds to form titanium silicide layers 310 at the upper portions of the single-crystal silicon germanium films 308 as shown in FIG. 6(c). Then, after the non-reacted titanium film portions are removed with a mixture solution of sulfuric acid, hydrogen peroxide and water, or the like, a thermal treatment at 900° C. is conducted for about 10 seconds to lower the titanium silicide layers 310 in resistance.

Then, deposited on the n-type silicon substrate 301 is an interlaminar insulating film 311, in which there are then formed metallic electrodes 312 respectively serving as a source electrode and a drain electrode, thus forming a semiconductor device according to the third embodiment.

According to the third embodiment, the growth rate of the single-crystal silicon germanium films 308 is high because the growth temperature of germanium itself is lower than the growth temperature of silicon itself. Accordingly, the growth rate of laminates of the single-crystal silicon films 307 and the single-crystal silicon germanium films 308, is higher than that of the conventional method of forming only the single-crystal silicon films. More specifically, the growth time of the single-crystal silicon films 307 is about 5 minutes, and the growth time of the single-crystal silicon germanium films 308 is about 2 minutes. Thus, the total growth time is about 7 minutes, which means a reduction to about ½ or less as compared with about 15 minutes according to the conventional method.

Because of their higher growth rate, the single-crystal silicon germanium films 308 are inferior in crystallinity. However, no influence is exerted to junction leak and the like because the upper portions of the single-crystal silicon germanium films 308 are changed into the titanium silicide layers 310 and the lower portions of the single-crystal silicon germanium films 308 are included in the impurity diffusion layers 309.

Further, the junction leak current is not increased in amount because the pn-junctions are formed inside of the single-crystal silicon films 307 excellent in crystallinity.

The single-crystal silicon germanium films 308 which are smaller in band gap than the single-crystal silicon films, can be reduced in resistance of contact with the titanium silicide layers 310.

Embodiment 4

With reference to FIG. 7(a) to FIG. 7(c) and FIG. 8(a) to FIG. 8(c), the following description will discuss a semiconductor device and a method of fabricating the same according to a fourth embodiment of the present invention.

Figure 7A:
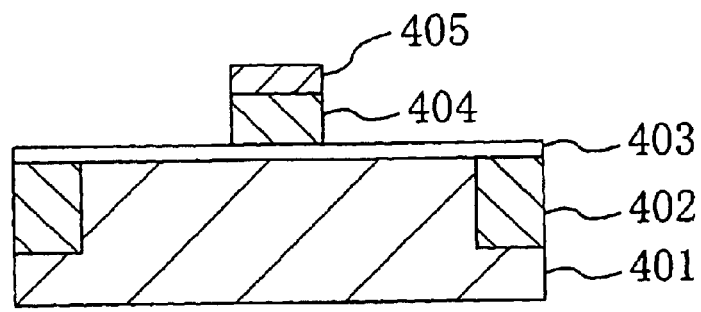
FIG. 7(a) to FIG. 7(c) are section views illustrating steps of a semiconductor device fabricating method according to a fourth embodiment of the present invention.

As shown in FIG. 7(a), an element separating area 402 such as LOCOS or trench is first formed, and a gate insulating film 403 having a thickness of 3~8 nm is then formed on a p-type silicon substrate 401. Then, according to a known method, there is formed, on the gate insulating film 403, a gate electrode comprising a lower n-type polycrystalline silicon layer 404 having a thickness of 100~300 nm and an upper silicon oxide film 405 having a thickness of 50~200 nm. The gate electrode has a gate length of 0.1 to 0.2 $\mu$m for example, and a gate width of 1~10 $\mu$M for example. Instead of the upper silicon oxide film 405, a silicon nitride film may be formed.

Figure 7B:
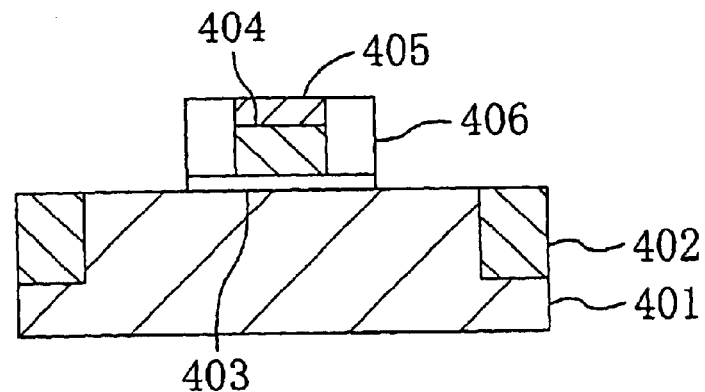

Then, a silicon nitride film having a thickness of 30~100 nm for example is deposited entirely on the p-type silicon substrate 401, and the silicon nitride film is then subjected to anisotropic dry etching to form a sidewall spacer 406 made of the silicon nitride film at the lateral sides of the gate electrode, as shown in FIG. 7(b). It is noted that the sidewall spacer 406 may also be formed by a silicon oxide film.

Figure 7C:
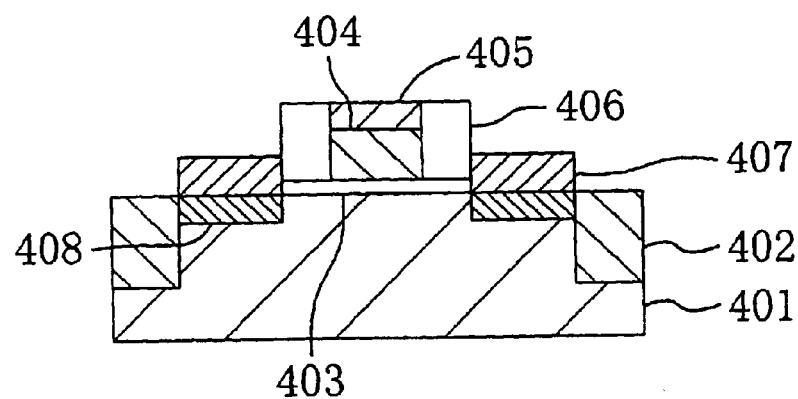

With the introduction of disilane gas at a flow rate of 3 sccm, phosphine gas at a flow rate of 0.005 sccm and chlorine gas at a flow rate of 0.02 sccm, epitaxial growth is conducted at treatment temperature of 630° C. Thus, as shown in FIG. 7(c), n-type first single-crystal silicon films 407 excellent in crystallinity having a thickness of about 50 nm, are formed on the p-type silicon substrate 401 at areas exposed from the gate electrode and the sidewall spacer 406. Also, as shown in FIG. 7(c), n-type low-concentration impurity layers 408 are formed in the p-type silicon substrate 401. Here, the chlorine gas is introduced to remove the amorphous silicon oxide films which undesirably grow on the silicon oxide film or the silicon nitride film.

At the step of growing the first single-crystal silicon films 407, the growth rate is as low as about 10 nm/min. However, precisely because the growth rate is low, the first single-crystal silicon films 407 are excellent in crystallinity and their crystal structures are substantially free from defects.

At the step of growing the first single-crystal silicon films 407, there may be used (i) other silicon compound gas such as silane gas, instead of the disilane gas, (ii) other n-type impurity compound gas such as arsine gas, instead of the phosphine gas, and (iii) other chlorine compound gas instead of the chlorine gas.

Figure 8A:
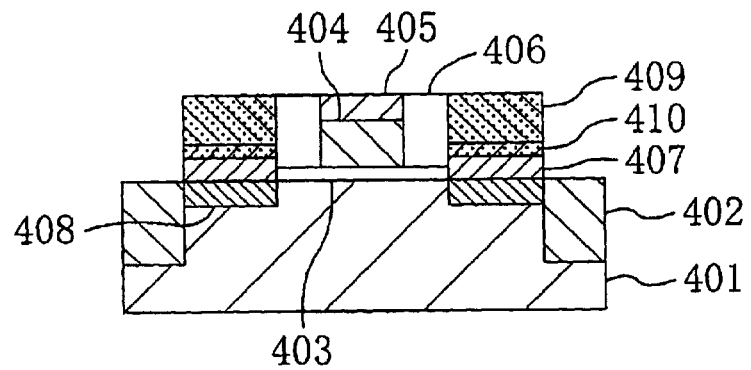
FIG. 8(a) to FIG. 8(c) are section views illustrating steps of the semiconductor device fabricating method according to the fourth embodiment of the present invention.

With the introduction of disilane gas at a flow rate of 3 sccm and chlorine gas at a flow rate of 0.04 sccm, epitaxial growth is conducted at treatment temperature of 700° C. Thus, as shown in FIG. 8(a), nondope-type second single-crystal silicon films 409 having a thickness of about 100 nm are formed on the first single-crystal silicon films 407. Here, the chlorine gas is introduced to remove the amorphous silicon oxide films which undesirably grow on the silicon oxide film or the silicon nitride film.

At the step of growing the second single-crystal silicon films 409, the growth rate is as high as about 40 nm/min. because the treatment temperature is higher than that at the step of growing the first single-crystal silicon films 407. However, precisely because the growth rate is high, the second single-crystal silicon films 409 are inferior in crystallinity to the first single-crystal silicon films 407 and their crystal structures contain defects.

At the step of growing the second single-crystal silicon films 409, there may be used (i) other silicon compound gas such as silane gas instead of the disilane gas, and (ii) other chlorine compound gas instead of the chlorine gas.

Instead of the second single-crystal silicon films 409, there may be formed films such as polycrystalline silicon films or amorphous silicon films which are high in growth rate but which are inferior in crystallinity to the first single-crystal silicon films 407.

Then, a dose $2 \times 10^{15}$ cm$^{-2}$ of arsenic ions is implanted into the first single-crystal silicon films 407 and the second single-crystal silicon films 409 at an energy of 40 keV, and a thermal treatment at temperature of 950° C. for example is then conducted for about 30 seconds. Thus, n-type high-concentration impurity layers 410 respectively serving as a drain and a source, are formed in the areas (shown by dots) extending both the whole second single-crystal silicon films 409 and the upper portions of the first single-crystal silicon films 407. At this time, the upper portions of the n-type first single-crystal silicon films 407 into which n-type impurity ions have been implanted, are changed into n-type high-concentration impurity areas. Thus, formed inside of the first single-crystal silicon films 407 are junction faces between the high-concentration impurity layers 410 and the low-concentration impurity layers (the lower areas of the first single-crystal silicon films 407).

It is noted that, instead of the arsenic ions, other n-type impurity ions such as phosphorus ions may be used as impurity ions for forming the n-type high-concentration impurity layers 410.

Figure 8B:
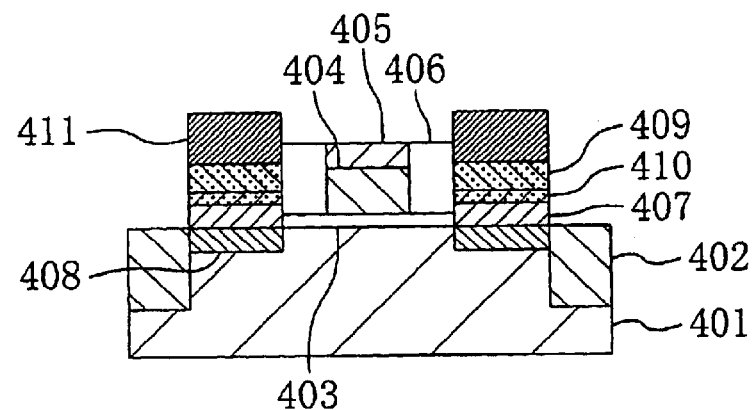

Then, a titanium film having a thickness of about 50 nm is deposited entirely on the p-type silicon substrate 401, and a thermal treatment at 650° C. is conducted for about 60 seconds to form titanium silicide layers 411 at the upper portions of the second single-crystal silicon films 409 as shown in FIG. 8(b). Then, after the non-reacted titanium film portions are removed with a mixture solution of sulfuric acid, hydrogen peroxide and water, or the like, a thermal treatment at 900° C. is conducted for about 10 seconds to lower the titanium silicide layers 411 in resistance.

Figure 8C:
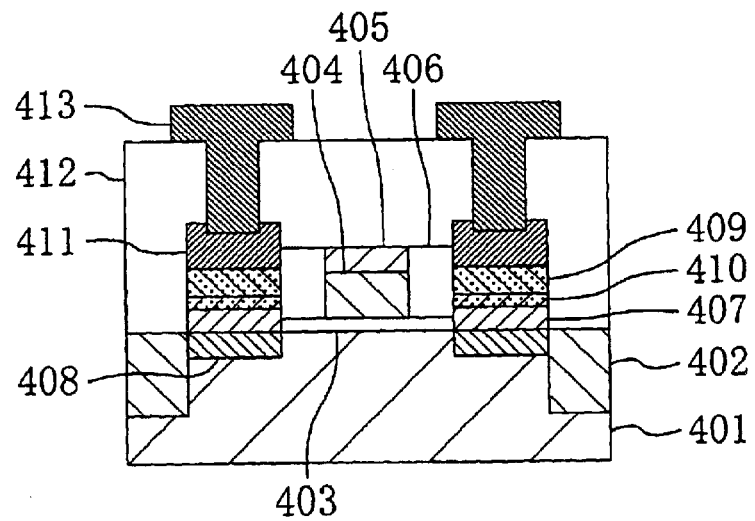

As shown in FIG. 8(c), deposited on the p-type silicon substrate 401 is an interlaminar insulating film 412, in which there are then formed metallic electrodes 413 respectively serving as a source electrode and a drain electrode, thus forming a semiconductor device according to the fourth embodiment.

According to the fourth embodiment, the growth rate is higher at the step of growing the second single-crystal silicon films 409 than at the step of growing the first single-crystal silicon films 407 because the treatment temperature is higher at the film 409 growing step than the film 407 growing step. Accordingly, the growth rate of laminates of the first and second single-crystal silicon films 407 and 409, is higher than that of the conventional method of forming only the single-crystal silicon films excellent in crystallinity. More specifically,the step of growing the first single-crystal silicon films 407 takes about 5 minutes as the growth time, and the step of growing the second single-crystal silicon films 409 takes about 2.5 minutes as the growth time. Thus, the total growth time is about 7.5 minutes, which means a reduction to about ½ as compared with about 15 minutes according to the conventional method.

Because of their higher growth rate, the second single-crystal silicon films 409 are inferior in crystallinity. However, no influence is exerted to junction leak and the like because the upper portions of the second single-crystal silicon films 409 are changed into the titanium silicide layers 411 and the lower portions of the second single-crystal silicon films 409 are included in the high-concentration impurity layers 410.

Further, the junction faces between the high-concentration impurity layers 410 and the low-concentration impurity layers, are formed inside of the first single-crystal silicon films 407 excellent in crystallinity. This prevents the junction leak current from being increased in amount.

Further, the low-concentration impurity layers 408 are interposed between the n-type high-concentration impurity layers 410 respectively serving as a source and a drain, and the p-type area of the p-type silicon substrate 401. This reduces the parasitic resistance.

Embodiment 5

With reference to FIG. 9(a) to FIG. 9(c) and FIG. 10(a) to FIG. 10(c), the following description will discuss a semiconductor device and a method of fabricating the same according to a fifth embodiment of the present invention.

Figure 9A:
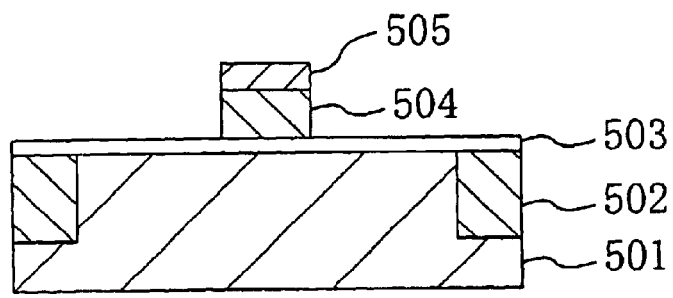
FIG. 9(a) to FIG. 9(c) are section views illustrating steps of a semiconductor device fabricating method according to a fifth embodiment of the present invention.

As shown in FIG. 9(a), an element separating area 502 such as LOCOS or trench is first formed, and a gate insulating film 503 having a thickness of 3~8 nm is then formed on a p-type silicon substrate 501. Then, according to a known method, there is formed, on the gate insulating film 503, a gate electrode comprising a lower n-type polycrystalline silicon layer 504 having a thickness of 100~300 nm and an upper silicon oxide film 505 having a thickness of 50~200 nm. The gate electrode has a gate length of 0.1 to 0.2 $\mu$m for example, and a gate width of 1~10 $\mu$m for example. Instead of the upper silicon oxide film 505, a silicon nitride film may be formed.

Figure 9B:
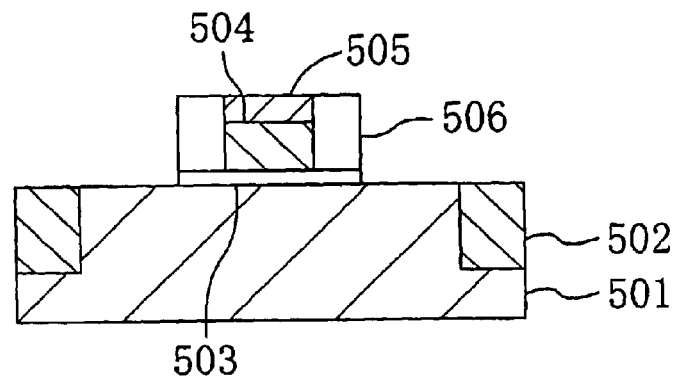

Then, a silicon nitride film having a thickness of 30~100 nm for example is deposited entirely on the p-type silicon substrate 501, and the silicon nitride film is then subjected to anisotropic dry etching to form a sidewall spacer 506 made of the silicon nitride film at the lateral sides of the gate electrode, as shown in FIG. 9(b). It is noted that the sidewall spacer 506 may also be formed by a silicon oxide film.

Figure 9C:
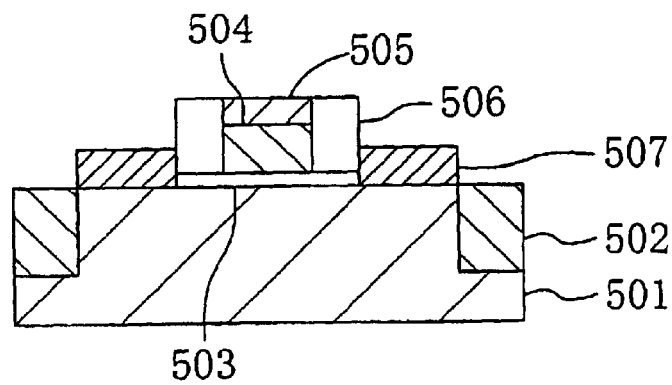

With the introduction of disilane gas at a flow rate of 3 sccm and chlorine gas at a flow rate of 0.02 sccm, epitaxial growth is conducted at treatment temperature of 630 ° C. Thus, as shown in FIG. 9(c), nondope-type first single-crystal silicon films 507 excellent in crystallinity having a thickness of about 50 nm, are formed on the p-type silicon substrate 501 at areas exposed from the gate electrode and the sidewall spacer 506. Here, the chlorine gas is introduced to remove the amorphous silicon oxide films which undesirably grow on the silicon oxide film or the silicon nitride film.

At the step of growing the first single-crystal silicon films 507, the growth rate is as low as about 10 nm/min. However, precisely because the growth rate is low, the first single-crystal silicon films 507 are excellent in crystallinity and their crystal structures are substantially free from defects.

At the step of growing the first single-crystal silicon films 507, there may be used (i) other silicon compound gas such as silane gas, instead of the disilane gas, and (ii) other chlorine compound gas instead of the chlorine gas.

Figure 10A:
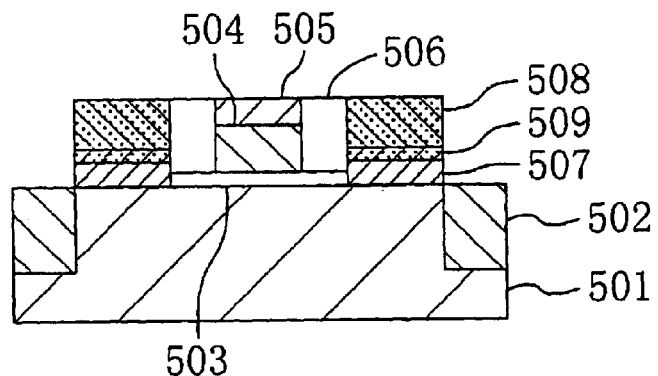
FIG. 10(a) to FIG. 10(c) are section views illustrating steps of the semiconductor device fabricating method according to the fifth embodiment of the present invention.

With the introduction of disilane gas at a flow rate of 3 sccm and chlorine gas at a flow rate of 0.04 sccm, epitaxial growth is conducted at treatment temperature of 700° C. Thus, as shown in FIG. 10(a), nondope-type second single-crystal silicon films 508 having a thickness of about 100 nm are formed on the first single-crystal silicon films 507. Here, the chlorine gas is introduced to remove the amorphous silicon oxide films which undesirably grow on the silicon oxide film or the silicon nitride film.

At the step of growing the second single-crystal silicon films 508, the growth rate is as high as about 40 nm/min. because the treatment temperature is higher than that at the step of growing the first single-crystal silicon films 507. However, precisely because the growth rate is high, the second single-crystal silicon 915 films 508 are inferior in crystallinity to the first single-crystal silicon films 507 and their crystal structures contain defects.

At the step of growing the second single-crystal silicon films 508, there may be used (i) other silicon compound gas such as silane gas instead of the disilane gas, and (ii) other chlorine compound gas instead of the chlorine gas.

Instead of the second single-crystal silicon films 508, there may be formed films such as polycrystalline silicon films or amorphous silicon films which are high in growth rate but which are inferior in crystallinity to the first single-crystal silicon films 507.

Then, a dose $2 \times 10^{15}$ cm$^{-2}$ of arsenic ions is implanted into the first single-crystal silicon films 507 and the second single-crystal silicon films 508 at an energy of 50 keV, and a thermal treatment at temperature of 950° C. for example is then conducted for about 30 seconds. Thus, n-type high-concentration impurity layers 509 respectively serving as a drain and a source, are formed in the areas (shown by dense dots) extending both the whole second single-crystal silicon films 508 and the upper portions of the first single-crystal silicon films 507. It is noted that, instead of the arsenic ions, other n-type impurity ions such as phosphorus ions may be used as impurity ions for forming the n-type high-concentration impurity layers 509.

Figure 10B:
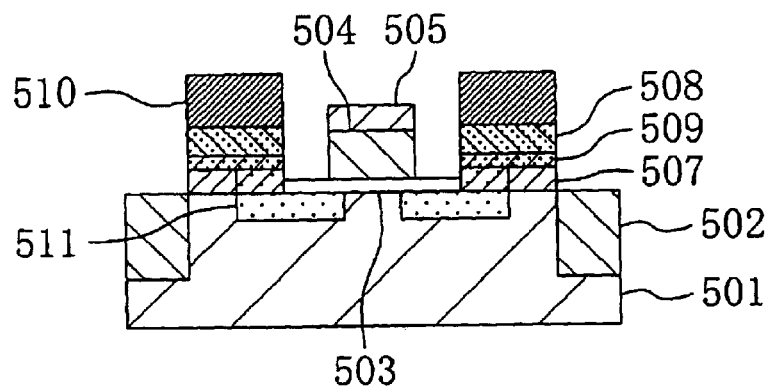

Then, a titanium film having a thickness of about 50 nm is deposited entirely on the p-type silicon substrate 501, and a if thermal treatment at 650° C. is conducted for about 60 seconds to form titanium silicide layers 510 at the upper portions of the second single-crystal silicon films 508 as shown in FIG. 10(b). Then, after the non-reacted titanium film portions are removed with a mixture solution of sulfuric acid, hydrogen peroxide and water, or the like, a thermal treatment at 900° C. is conducted for about 10 seconds to lower the titanium silicide layers 510 in resistance. Then, the sidewall spacer 506 is selectively removed by dry etching.

Then, a dose $1 \times 10^{15}$ cm$^{-2}$ of arsenic ions is implanted into the p-type silicon substrate 501 and the first single-crystal silicon films 507 at an energy of 10 keV, and a thermal treatment at temperature of 950° C. for example is then conducted for about 30 seconds. Thus, L-shape low-concentration impurity layers 511 are formed in the areas (shown by coarse dots) extending over both the areas of the first single-crystal silicon films 507 at the side of the gate electrode and the p-type silicon substrate 501.

Figure 10C:
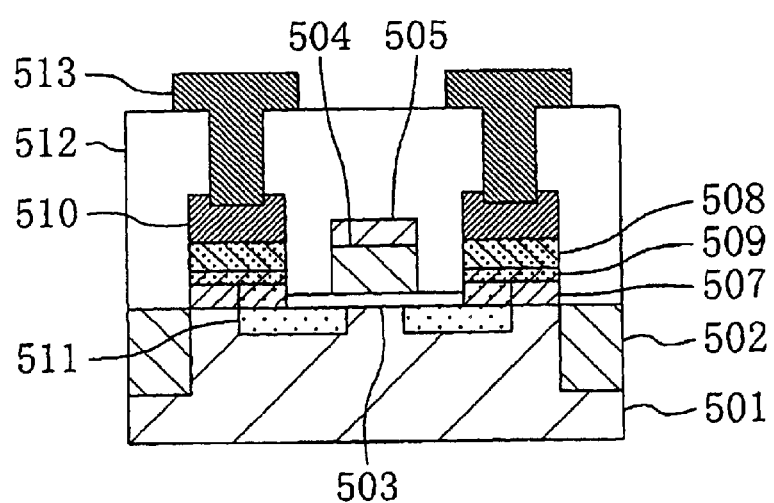

As shown in FIG. 10(c), deposited on the p-type silicon substrate 501 is an interlaminar insulating film 512 in which there are then formed metallic electrodes 513 respectively serving as a source electrode and a drain electrode, thus forming a semiconductor device according to the fifth embodiment.

According to the fifth embodiment, the growth rate is higher at the step of growing the second single-crystal silicon films 508 than at the step of growing the first single-crystal silicon films 507 because the treatment temperature is higher at the film 508 growing step than the film 507 growing step. Accordingly, the growth rate of laminates of the first and second single-crystal silicon films 507 and 508, is higher than that of the conventional method of forming only the single-crystal silicon films excellent in crystallinity. More specifically, the step of growing the first single-crystal silicon films 507 takes about 5 minutes as the growth time, and the step of growing the second single-crystal silicon films 508 takes about 2.5 minutes as the growth time. Thus, the total growth time is about 7.5 minutes, which means a reduction to about ½ as compared with about 15 minutes according to the conventional method.

Because of their higher growth rate, the second single-crystal silicon films 508 are inferior in crystallinity. However, no influence is exerted to junction leak and the like because the upper portions of the second single-crystal silicon films 508 are changed into the titanium silicide layers 510 and the lower portions of the second single-crystal silicon films 508 are included in the high-concentration impurity layers 509.

Further, the junction faces between the high-concentration impurity layers 509 and the low-concentration impurity layers 511, are formed inside of the first single-crystal silicon films 507 excellent in crystallinity. This prevents the junction leak current from being increased in amount.

Further, the low-concentration impurity layers 511 are interposed between the n-type high-concentration impurity layers 509 respectively serving as a source and a drain, and the channel region of the p-type silicon substrate 501. This reduces the parasitic resistance.

Embodiment 6

With reference to FIG. 11(a) to FIG. 11(c) and FIG. 12(a) to FIG. 12(c), the following description will discuss a semiconductor device and a method of fabricating the same according to a sixth embodiment of the present invention.

Figure 11A:
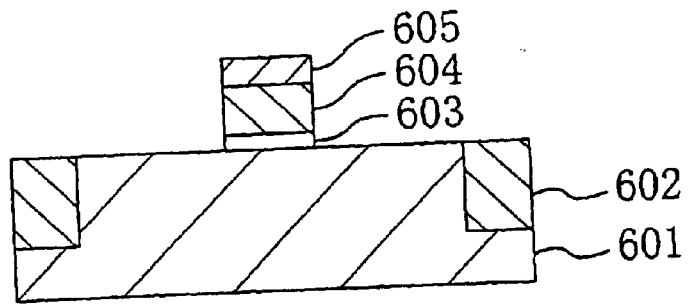
FIG. 11(a) to FIG. 11(c) are section views illustrating steps of a semiconductor device fabricating method according to a sixth embodiment of the present invention.

As shown in FIG. 11(a), an element separating area 602 such as LOCOS or trench is first formed, and a gate insulating film 603 having a thickness of 3~8 nm is then formed on a p-type silicon substrate 601. Then, according to a known method, there is formed, on the gate insulating film 603, a gate electrode comprising a lower n-type polycrystalline silicon layer 604 having a thickness of 100~300 nm and an upper silicon oxide film 605 having a thickness of 50~200 nm. The gate electrode has a gate length of 0.1 to 0.2 μm for example, and a gate width of 1~10 μm for example. Instead of the upper silicon oxide film 605, a silicon nitride film may be formed.

Figure 11B:
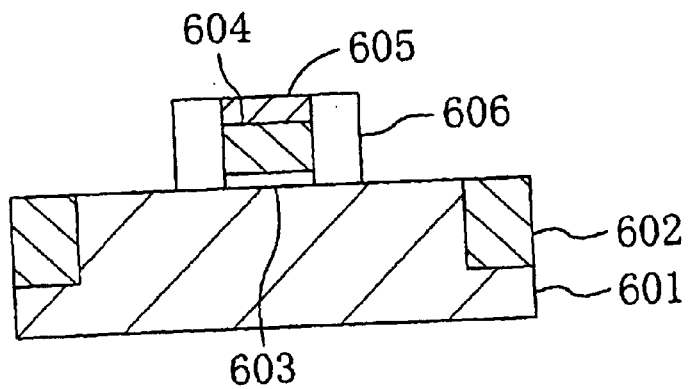

Then, deposited entirely on the p-type silicon substrate 601 is a PSG film having a thickness of 30~100 nm for example and having a phosphorus concentration of $1 \times 10^{21}$ cm$^{-2}$, and the PSG film is then subjected to anisotropic dry etching to form a sidewall spacer 606 made of the PSG film at the lateral sides of the gate electrode, as shown in FIG. 11(b).

Figure 11C:
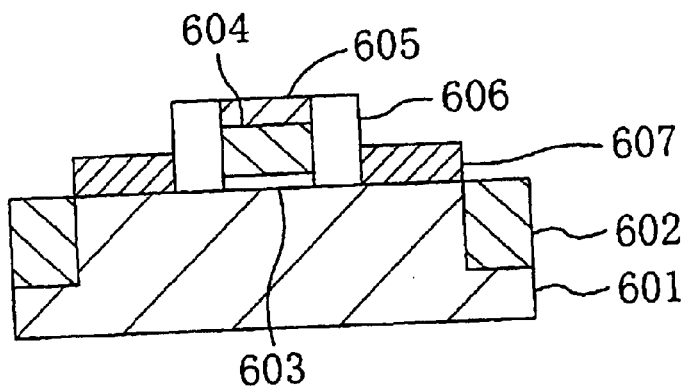

With the introduction of disilane gas at a flow rate of 3 sccm and chlorine gas at a flow rate of 0.02 sccm, epitaxial growth is conducted at treatment temperature of 630° C. Thus, as shown in FIG. 11(c), nondope-type first single-crystal silicon films 607 excellent in crystallinity having a thickness of about 50 nm, are formed on the p-type silicon substrate 601 at areas exposed from the gate electrode and the sidewall spacer 606. Here, the chlorine gas is introduced to remove the amorphous silicon oxide films which undesirably grow on the silicon oxide film or the silicon nitride film.

At the step of growing the first single-crystal silicon films 607, the growth rate is as low as about 10 nm/min. However, precisely because the growth rate is low, the first single-crystal silicon films 607 are excellent in crystallinity and their crystal structures are substantially free from defects.

At the step of growing the first single-crystal silicon films 607, there may be used (i) other silicon compound gas such as silane gas, instead of the disilane gas and (ii) other chlorine compound gas instead of the chlorine gas.

Figure 12A:
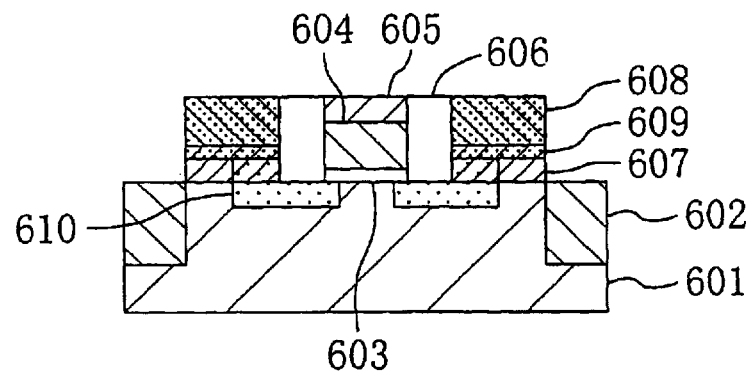
FIG. 12(a) to FIG. 12(c) are section views illustrating steps of the semiconductor device fabricating method according to the sixth embodiment of the present invention.

With the introduction of disilane gas at a flow rate of 3 sccm and chlorine gas at a flow rate of 0.04 sccm, epitaxial growth is conducted at treatment temperature of 700° C. Thus, as shown in FIG. 12(a), there are formed, on the first single-crystal silicon films 607, nondope-type second single-crystal silicon films 608 inferior in crystallinity having a thickness of about 100 nm. Here, the chlorine gas is introduced to remove the amorphous silicon oxide films which undesirably grow on the silicon oxide film or the silicon nitride film.

At the step of growing the second single-crystal silicon films 608, the growth rate is as high as about 40 nm/min. because the treatment temperature is higher than that at the step of growing the first single-crystal silicon films 607. However, precisely because the growth rate is high, the second single-crystal silicon films 608 are inferior in crystallinity to the first single-crystal silicon films 607 and their crystal structures contain defects.

At the step of growing the second single-crystal silicon films 608, there may be used (i) other silicon compound gas such as silane gas instead of the disilane gas, and (ii) other chlorine compound gas instead of the chlorine gas.

Instead of the second single-crystal silicon films 608, there may be formed films such as polycrystalline silicon films or amorphous silicon films which are high in growth rate but which are inferior in crystallinity to the first single-crystal silicon films 607.

Then, a dose $2 \times 10^{15}$ cm$^-$of arsenic ions is implanted into the first single-crystal silicon films 607 and the second single-crystal silicon films 608 at an energy of 50 keV, and a thermal treatment at temperature of 950° C. for example is then conducted for about 30 seconds. Thus, n-type high-concentration impurity layers 609 respectively serving as a drain and a source, are formed in the areas (shown by dense dots) extending both the whole second single-crystal silicon films 608 and the upper portions of the first single-crystal silicon films 607. This thermal treatment diffuses the phosphorus contained in the sidewall spacer 606 into the first single-crystal silicon films 607 and the p-type silicon substrate 601. Thus, L-shape low-concentration impurity layers 610 are formed in the areas (shown by coarse dots) extending over both the areas of the first single-crystal silicon films 607 at the side of the gate electrode and the p-type silicon substrate 601.

Alternatively, there may be conducted a thermal treatment at 950° C. for about 30 seconds between the step of forming the first single-crystal silicon films 607 and the step of forming the second single-crystal silicon films 608, such that the low-concentration impurity layers 610 are formed in the areas extending over both those areas of the first single-crystal silicon films 607 at the side of the gate electrode and the p-type silicon substrate 601.

It is noted that, instead of the arsenic ions, other n-type impurity ions such as phosphorus ions may be used as impurity ions for forming the n-type high-concentration impurity layers 609.

Figure 12B:
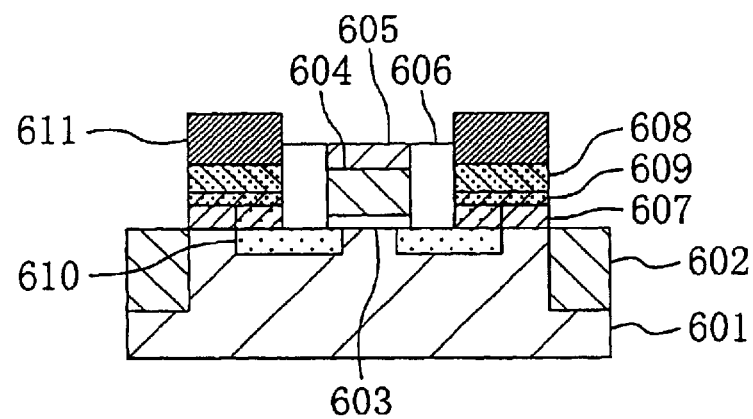

Then, a titanium film having a thickness of about 50 nm is deposited entirely on the p-type silicon substrate 601, and a thermal treatment at 650° C. is then conducted for about 60 seconds to form titanium silicide layers 611 at the upper portions of the second single-crystal silicon films 608 as shown in FIG. 12(b). Then, after the non-reacted titanium film portions are removed with a mixture solution of sulfuric acid, hydrogen peroxide and water, or the like, a thermal treatment at 900° C. is conducted for about 10 seconds to lower the titanium silicide layers 611 in resistance.

Figure 12C:
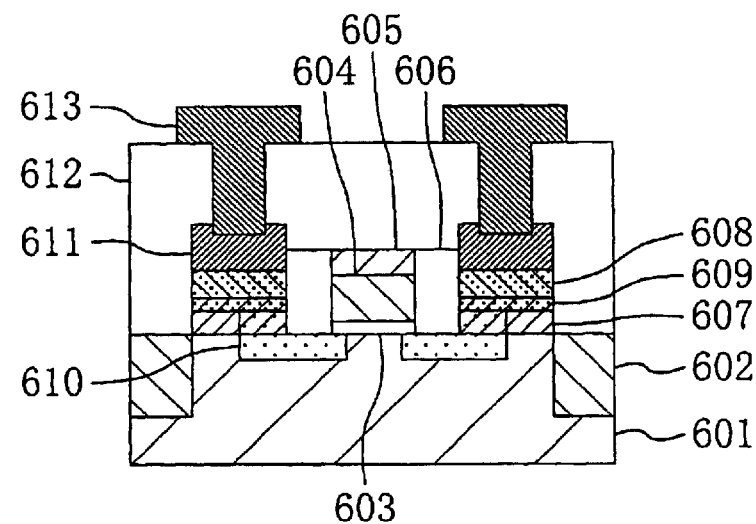
Figure 13A:
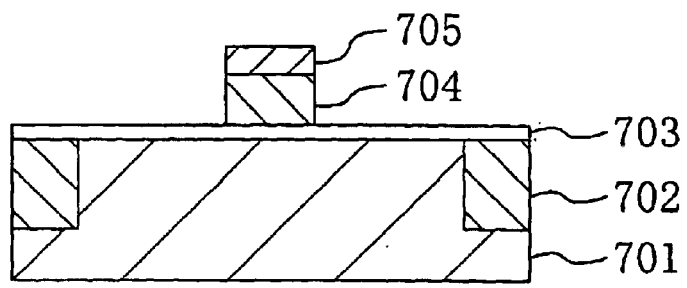
FIG. 13(a) to FIG. 13(d) are section views illustrating steps of a semiconductor device fabricating method of prior art.
Figure 13B:
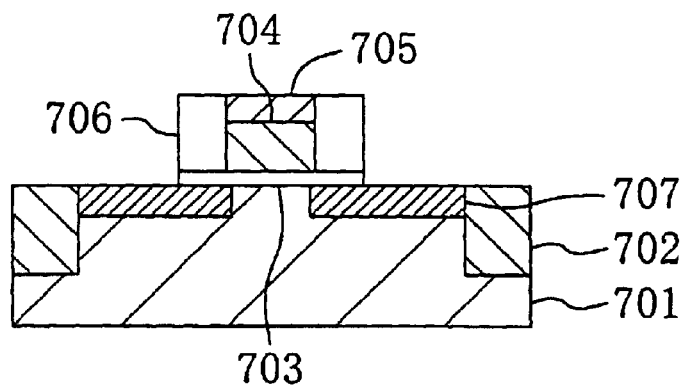
Figure 13C:
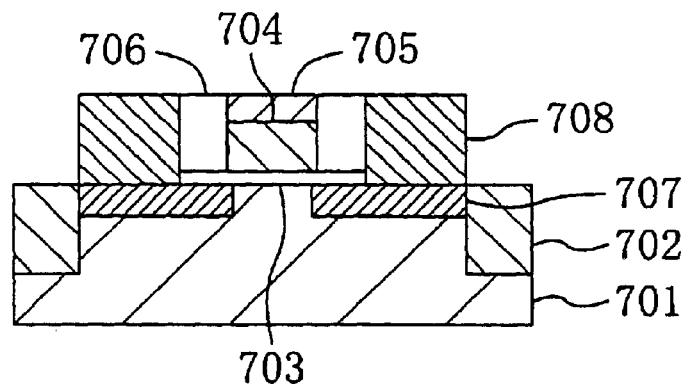
Figure 13D:
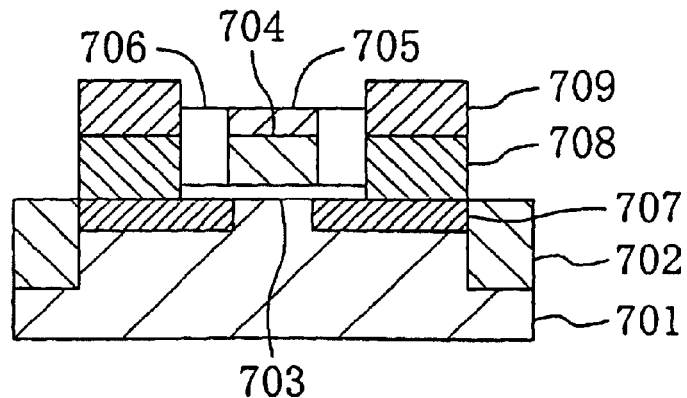

As shown in FIG. 12(c), deposited on the p-type silicon substrate 601 is an interlaminar insulating film 612, in which there are then formed metallic electrodes 613 respectively serving as a source electrode and a drain electrode, thus forming a semiconductor device according to the sixth embodiment.

According to the sixth embodiment, the growth rate is higher at the step of growing the second single-crystal silicon films 608 than at the step of growing the first single-crystal silicon films 607 because the treatment temperature is higher at the film 608 growing step than the film 607 growing step. Accordingly, the growth rate of laminates of the first and second single-crystal silicon films 607 and 608, is higher than that of the conventional method of forming only the single-crystal silicon films excellent Is in crystallinity. More specifically, the step of growing the first single-crystal silicon films 607 takes about 5 minutes as the growth time, and the step of growing the second single-crystal silicon films 608 takes about 2.5 minutes as the growth time. Thus, the total growth time is about 7.5 minutes, which means a reduction to about ½ as compared with about 15 minutes according to the conventional method.

Because of their higher growth rate, the second single-crystal silicon films 608 are inferior in crystallinity. However, no influence is exerted to junction leak and the like because the upper portions of the second single-crystal silicon films 608 are changed into the titanium silicide layers 611 and the lower portions of the second single-crystal silicon films 608 are included in the high-concentration impurity layers 609.

Further, the junction faces between the high-concentration impurity layers 609 and the low-concentration impurity layers 610, are formed inside of the first single-crystal silicon films 607 excellent in crystallinity. This prevents the junction leak current from being increased in amount.

Further, the low-concentration impurity layers 610 are interposed between the n-type high-concentration impurity layers 609 respectively serving as a source and a drain, and the channel region of the p-type silicon substrate 601. This reduces the parasitic resistance.

What is claimed is:

1. A semiconductor device comprising:
   an element separating area formed on a semiconductor substrate of a first conductivity type;

a gate electrode formed on an inner region surrounded by said element separating area on said semiconductor substrate, and having a gate insulating film interposed therebetween;

a sidewall spacer formed only on both lateral sides of said gate electrode, and the sidewall spacer is composed of an insulating film;

a pair of laminates formed respectively on said semiconductor substrate at both lateral sides of said gate electrode with being in contact with said sidewall spacer, each of said laminates including a lower first semiconductor layer made of silicon and an upper second semiconductor layer mainly made of silicon; and first impurity layers of a second conductivity type, respectively serving as a source or a drain, and respectively formed as extending over both upper areas of said first semiconductor layers and the entire areas of said second semiconductor layers, wherein said first semiconductor layers being made of single-crystal silicon film relatively superior in crystallinity, in that the first semiconductor layers contain substantially no crystal defects, within said inner region, and wherein said second semiconductor layers being made of single-crystal films or polycrystalline films, which are relatively inferior in crystallinity, in that the single-crystal or polycrystalline films of the second semiconductor layers contain crystal defects, or being made of amorphous films.

2. A semiconductor device according to claim 1, wherein said second semiconductor layers contain germanium.

3. A semiconductor device according to claim 1, wherein lower areas of said first semiconductor layers are composed of second impurity layers of the first conductivity type, and pn-junctions are formed in the inner portion of said first semiconductor layers.

4. A semiconductor device according to claim 1, wherein lower areas of said first semiconductor layers are composed of third impurity layers of the second conductivity type, and of which impurity-concentrations are lower than that of said first impurity layers.

5. A semiconductor device according to claim 4, further comprising fourth impurity layers of the second conductivity type and of which impurity-concentrations are lower than that of said first impurity layers, said fourth impurity layers being formed in the areas of said semiconductor substrate which come in contact with said first semiconductor layers.

6. A semiconductor device according to claim 2, wherein lower areas of said first semiconductor layers are composed of second impurity layers of the first conductivity type, and a pn-junctions are formed in the inner portion of said first semiconductor layers.

7. A semiconductor device according to claim 1, wherein said first semiconductor layers and said second semiconductor layers are mutually connected via a flat contact surface.

8. A semiconductor device according to claim 1 further comprises, a silicide layer formed on said second semiconductor layer.

9. A semiconductor device according to claim 8 further comprises, an interlayer insulating film formed over said suicide layer, and a metal electrode formed through said interlayer insulating film and connected to said suicide layer.

10. A semiconductor device according to claim 1 further comprises a trench-type element separation area formed in said semiconductor substrate.

11. A semiconductor device according to claim 1 further comprises, an interlayer insulating film formed over said gate electrode and said second semiconductor layer, and a metal electrode formed through said interlayer insulating film and electrically connected to said second semiconductor layer.

12. A semiconductor device comprising:

an element separating area formed on a semiconductor substrate of a first conductivity type;

a gate electrode formed on an inner region surrounded by said element separating area on said semiconductor substrate, and having a gate insulating film interposed therebetween;

a sidewall spacer formed only on both lateral sides of said gate electrode, and the sidewall spacer is composed of an insulating film;

a pair of laminates formed respectively on said semiconductor substrate at both lateral sides of said gate electrode with being in contact with said sidewall spacer, each of said laminates including a lower first semiconductor layer made of silicon and an upper second semiconductor layer mainly made of silicon; and first impurity layers of a second conductivity type, respectively serving as a source or a drain, and respectively formed as extending over both the upper areas of said first semiconductor layers and the entire areas of said second semiconductor layers, wherein said first semiconductor layers being composed of single-crystal silicon film are formed by conducting an epitaxial growth within said inner region at a low rate directly on an entire exposed area at which no said gate electrode and no said sidewall spacer exists such that the first semiconductor layers are relatively superior in crystallinity in that the first semiconductor layers contain substantially no crystal defects, and wherein said second semiconductor layers being composed of single-crystal films or polycrystalline films, which are relatively inferior in crystallinity in that the single-crystal or polycrystalline films of the second semiconductor layers contain crystal defects, or being composed of amorphous films.

13. A semiconductor device according to claim 12, wherein said second semiconductor layers contain germanium.

14. A semiconductor device according to claim 12, wherein lower areas of said first semiconductor layers are composed of second impurity layers of the first conductivity type, and pn-junctions are formed in the inner portion of said first semiconductor layers.

15. A semiconductor device according to claim 12, wherein lower areas of said first semiconductor layers are composed of third impurity layers of the second conductivity type, and of which impurity-concentrations are lower than that of said first impurity layers.

16. A semiconductor device according to claim 15, further comprising fourth impurity layers of the second conductivity type and of which impurity-concentrations are lower than that of said first impurity layers, said fourth impurity layers being formed in the areas of said semiconductor substrate which come in contact with said first semiconductor layers.

17. A semiconductor device according to claim 13, wherein lower areas of said first semiconductor layers are composed of second impurity layers of the first conductivity type, and a pn-junctions are formed in the inner portion of said first semiconductor layers.

18. A semiconductor device according to claim 12, wherein said first semiconductor layers and said second semiconductor layers are mutually connected via a flat contact surface.

19. A semiconductor device according to claim 12 further comprises, a silicide layer formed on said second semiconductor layer.

20. A semiconductor device according to claim 19 further comprises, an interlayer insulating film formed over said silicide layer, and a metal electrode formed through said interlayer insulating film and connected to said silicide layer.

21. A semiconductor device according to claim 12 further comprises a trench-type element separation area formed in said semiconductor substrate.

22. A semiconductor device according to claim 12 further comprises, an interlayer insulating film formed over said gate electrode and said second semiconductor layer, and a metal electrode formed through said interlayer insulating film and electrically connected to said second semiconductor layer.

* * * * *